United States Patent [19]
Bradford, III et al.

[11] Patent Number: 5,523,873
[45] Date of Patent: Jun. 4, 1996

[54] LCD HEATER WITH FLEX CIRCUIT BUSS BARS

[75] Inventors: Brian K. Bradford, III, Davisberg; Paul A. Voisin, Walled Lake, both of Mich.

[73] Assignee: OIS Optical Imaging Systems, Inc., Troy, Mich.

[21] Appl. No.: 220,288

[22] Filed: Aug. 30, 1994

Related U.S. Application Data

[63] Continuation-in-part of Ser. No. 200,670, Feb. 23, 1994, Pat. No. 5,436,745.

[51] Int. Cl.$^6$ .................. G02F 1/133; G02F 1/1345; G02F 1/1333
[52] U.S. Cl. .................. 359/88; 359/87
[58] Field of Search .................. 359/88, 83, 87, 359/62, 86, 43, 44

[56] References Cited

U.S. PATENT DOCUMENTS

| | | | |
|---|---|---|---|
| 4,093,355 | 6/1978 | Kaplit et al. | 350/334 |
| 4,119,842 | 10/1978 | Hayden et al. | 250/201 |
| 4,122,524 | 10/1978 | McCrory et al. | 359/69 |
| 4,206,501 | 6/1980 | Brooks | 362/293 |
| 4,623,222 | 11/1986 | Itoh et al. | 350/331 T |
| 4,643,525 | 2/1987 | Haim | 350/331 R |
| 4,655,551 | 4/1987 | Washizuka et al. | 350/334 |
| 4,721,363 | 1/1988 | Inoue | 350/331 T |
| 4,723,835 | 2/1988 | Franklin | 359/86 |
| 4,772,100 | 9/1988 | Suenaga | 350/336 |
| 4,773,735 | 9/1988 | Ukrainsky et al. | 350/331 T |
| 4,775,221 | 10/1988 | Baumgartner, Jr. | 350/331 T |
| 4,836,651 | 6/1989 | Anderson | 350/334 |
| 4,862,153 | 8/1989 | Nakatani et al. | 340/719 |
| 4,958,911 | 9/1990 | Beiswenger et al. | 350/331 R |
| 4,987,289 | 1/1991 | Bishop et al. | 219/209 |
| 5,029,984 | 7/1991 | Adachi et al. | 350/334 |
| 5,054,891 | 10/1991 | Higa et al. | 359/43 |
| 5,120,665 | 6/1992 | Tsukagoshi et al. | 437/8 |
| 5,155,612 | 10/1992 | Adachi et al. | 359/80 |
| 5,164,849 | 11/1992 | Evans et al. | 359/45 |
| 5,168,384 | 12/1992 | Genba | 359/83 |
| 5,243,453 | 9/1993 | Kawaguchi et al. | 359/74 |
| 5,247,374 | 9/1993 | Terada | 359/44 |
| 5,387,764 | 2/1995 | Blom et al. | 174/261 |

FOREIGN PATENT DOCUMENTS

| | | | |
|---|---|---|---|
| 57-617 | 1/1982 | Japan | 359/86 |
| 59-97120 | 6/1984 | Japan | 359/86 |

OTHER PUBLICATIONS

"Meeting the Challenges of Flexible Circuits" Article, Jul. 1992, Jack Lexin, Printed Circuit Design.

*Primary Examiner*—William L. Sikes
*Assistant Examiner*—Charles Miller
*Attorney, Agent, or Firm*—Myers, Liniak & Berenato

[57] ABSTRACT

An LCD heater includes a substantially transparent ITO heating layer deposited on a transparent glass rear cover sheet, the ITO layer being mounted adjacent a planar surface of the display's rear polarizer. The ITO layer has a pair of substantially parallel flex circuit buss bars adhered thereto, the buss bars being sandwiched between the rear polarizer and the ITO heater layer.

15 Claims, 10 Drawing Sheets

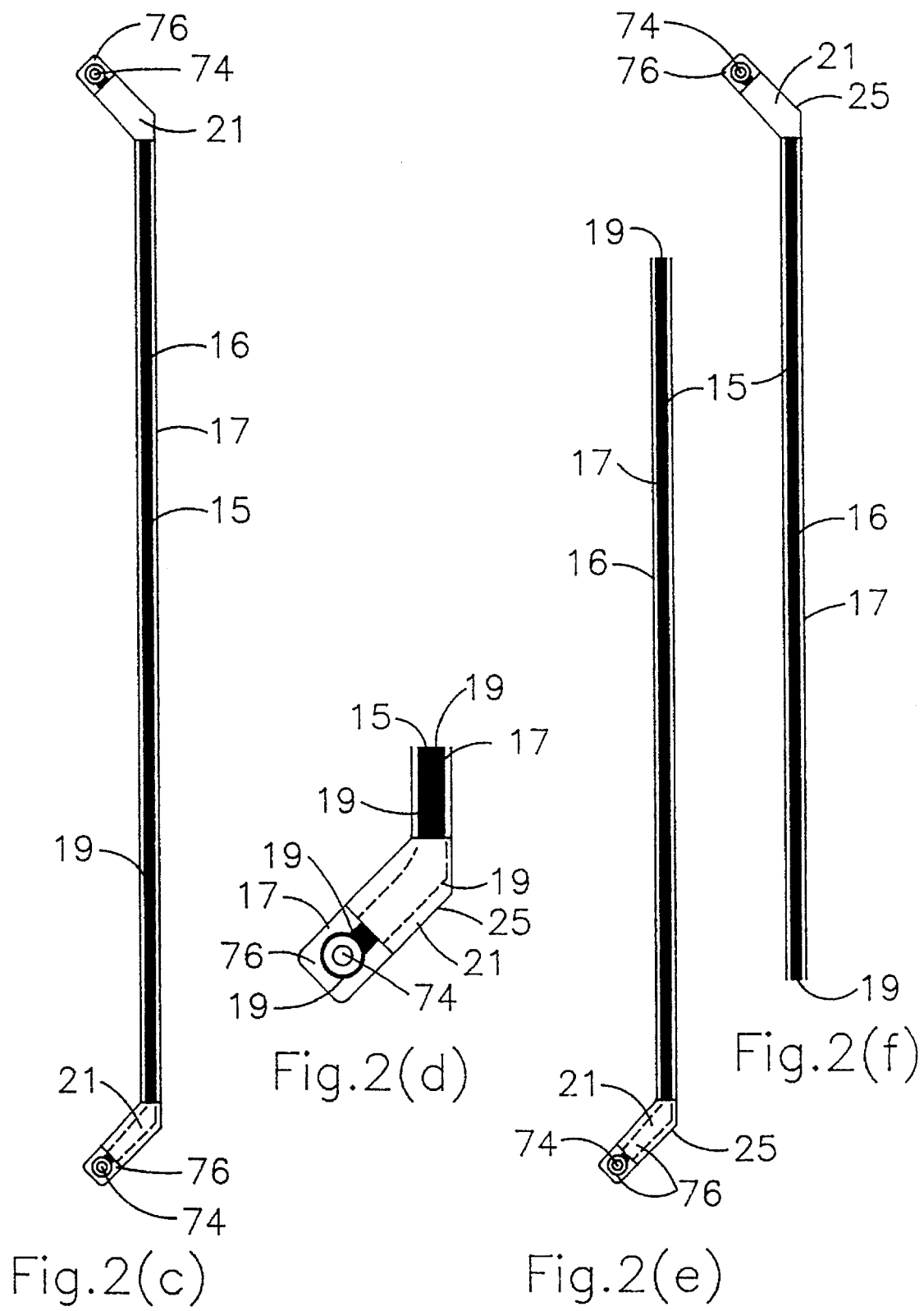

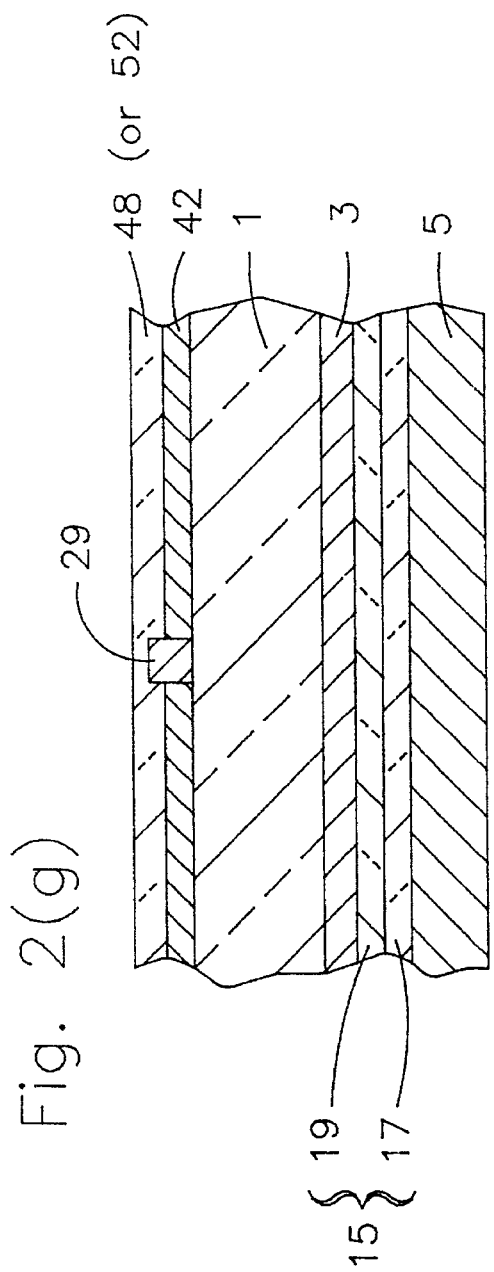
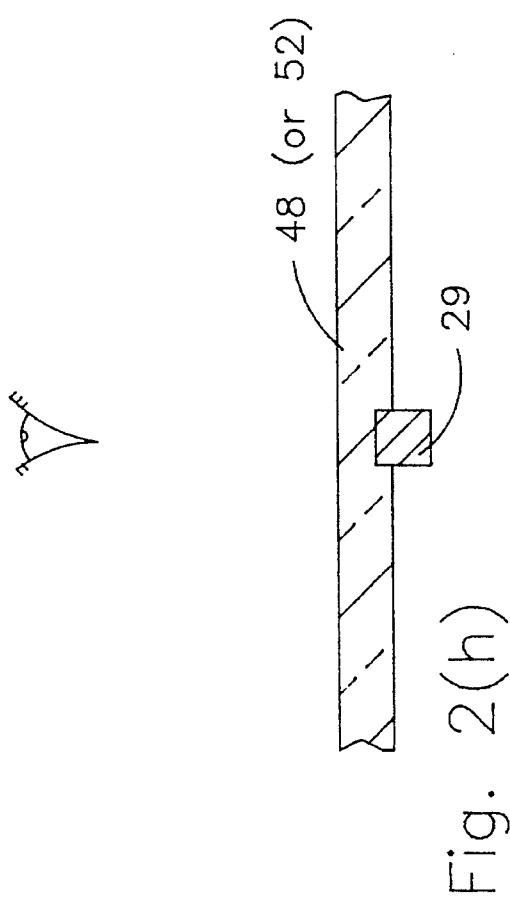
Fig. 2(g)
Fig. 2(h)

LCD HEATER WITH FLEX CIRCUIT BUSS BARS

This is a continuation-in-part application of U.S. Ser. No. 08/200,670, filed Feb. 23, 1994 now U.S. Pat. No. 5,436,745, "FLEX CIRCUIT BOARD FOR LIQUID CRYSTAL DISPLAY", the disclosure of which is hereby incorporated herein by reference.

This invention relates to a heater for a liquid crystal display. More particularly, this invention relates to an LCD heater including flex circuit buss bars disposed on a conductive heating layer.

BACKGROUND OF THE INVENTION

Liquid crystal displays have found widespread usage in the prior art, one such display being, for example, of the twisted nematic liquid crystal type. Such LCDs operate by applying an alternating voltage potential between opposing electrodes sandwiching a liquid crystal layer.

Twisted nematic displays used, for example, in cockpits of air vehicles typically include a matrix array of liquid crystal picture elements (i.e. pixels) and a corresponding backlight for illuminating the elements. These pixels are often temperature-dependent with respect to their normal operating characteristics in that an LCD relies on the behavioral characteristics of its twisted nematic crystalline layer as it is exposed to driving voltages. When such driving voltages are applied across the LC material, the nematic liquid crystals tend to align themselves so as to provide a desired image to the viewer. Because such voltage-related behavior of the twisted nematic material is a function of temperature, the overall performance of the corresponding display is temperature dependent. When below a predetermined temperature, twisted nematic liquid crystal material does not behave in a consistent manner. Accordingly, the LC material in such situations must be heated to the aforesaid predetermined temperature in order to achieve satisfactory functionality. The amount of time it takes for the LC material to be heated to this level is known as the display's "warm-up" period or time.

It is known to provide liquid crystal displays with heaters. U.S. Pat. Nos. 4,643,525, 4,723,835, and 5,247,374 are typical examples of such liquid crystal display heaters, just to name a few.

LCD heaters including a conductive ITO coating deposited on a transparent glass substrate are old and well-known in the art. In such heaters, the ITO coating is typically energized by way of a pair of parallel buss bars aligned along a planar surface of the ITO. Heretofore, such buss bars have been made of either silk-screened conductive epoxy or deposited metal, the deposited metal including, for example, a tri-layer combination of chrome, nickel, and gold. Such conventional LCD heaters and corresponding buss bars have several drawbacks discussed as follows.

Conductive epoxy buss bars which are silk-screened onto the ITO heater layer experience less than desirable conductance. This lack of conductance associated with typical epoxy buss bars often leads to a more lengthy than desired required time period for warming up corresponding displays. In other words, the use of epoxy buss bars often necessitates an increased display warm-up period.

A display's warm-up period is very important. For example, the warm-up period/time of a cockpit mounted display in a military jet aircraft sitting on an Alaskan runway on alert dictates the time the pilot must wait before taking off. Accordingly, the smaller the requisite warm-up period, the better.

Furthermore, in order to interface such prior art epoxy buss bars to a corresponding voltage source, a conductive wire is typically provided, one end of the wire being adhered to the epoxy buss bar and the other end conductively attached to the voltage source. The process of conductively attaching the wire to both the epoxy buss bar on the ITO surface and the corresponding voltage source is time consuming, messy, and often unreliable. Additionally, the silk-screening of such epoxy buss bars is also an expensive and time consuming process.

The use of deposited metal (e.g. chrome, nickel, gold tri-layer combination) as a buss bar on an ITO layer also has a number of disadvantages associated therewith. First of all, the deposition of the metal onto the ITO layer is difficult, expensive, and time consuming. Secondly, in order to interface the deposited metal buss bar with a corresponding voltage source, a wire is typically soldered onto the metal buss bar. This soldering process is difficult and fragile in that if the solder is overheated, the result is a burned out buss bar.

Another drawback of the aforesaid prior art buss bars is the thickness of the electrical connection points interfacing the buss bars and corresponding electrical supply (i.e. how far such connections protrude from the planar ITO surface). These protrusions are stress concentrators if sandwiched between plates, and pose significant design problems. Because of the relatively thick nature of such connections, the transparent glass substrate supporting the ITO layer is typically adhered directly to the exterior surface of a corresponding display's rear polarizer, thereby positioning the supporting glass substrate between the ITO heater layer and the display itself. This distancing of the heater layer from the liquid crystal material unfortunately insulates the interior of the display from the warmth or heat generated by the ITO, necessarily increasing the display's warm-up time. Furthermore, because in the prior art the glass is between the ITO layer and the display's rear polarizer, the ITO is exposed to the outer environment, thus leading to much of the ITO generated heat escaping into the adjacent atmosphere thus resulting in an increased warm-up period.

Another problem associated with having the ITO layer exposed to the atmosphere is the possibility of the ITO being scratched. If this occurs, the entire LCD cell must immediately be replaced.

As will be appreciated by those of skill in the art, the aforesaid prior art provisions of heaters within liquid crystal displays are difficult and costly processes which do not leave much room for error.

It is apparent from the above that there exists a need in the art for an LCD heater including a conductive heating layer (e.g. ITO layer) disposed adjacent the rear display polarizer so as to decrease the display's warm-up period and reduce the possibility of the ITO being scratched. There also exists a need in the art for a pair of relatively thin and easy to install and electrically connect buss bars for energizing the heating conductive layer, the buss bars being deposited substantially in parallel to one another on the conductive layer.

SUMMARY OF THE INVENTION

Generally speaking this invention fulfills the above-described needs in the art by providing a liquid crystal display comprising:

first and second polarizers sandwiching a liquid crystal layer therebetween;

electrode means for applying a voltage across the liquid crystal layer;

a heater disposed adjacent (directly or otherwise) the first polarizer, the heater comprising a conductive layer having a substantially planar flex circuit buss bar disposed thereon, the buss bar for delivering power to the conductive layer thereby enabling the conductive layer to heat the liquid crystal display.

This invention further fulfills the above-described needs in the art by providing a heater assembly for a liquid crystal display, the heater assembly comprising:

a conductive layer disposed on a transparent substrate;

means for energizing the conductive layer in order to heat the liquid crystal display, the means including a pair of flex circuit buss bars mounted on the conductive layer;

the flex circuit buss bars each having a first and second portion, the first portion being adhered and parallel to the conductive layer, and the second portion extending outwardly from the periphery of the conductive layer.

This invention further fulfills the above-described needs in the art by providing a process of making a liquid crystal display, the process comprising the steps of:

a) providing first and second polarizers sandwiching a liquid crystal layer therebetween;

b) providing an electrode means for applying a voltage across the liquid crystal layer; and c) disposing a heater adjacent the first polarizer, the heater including a conductive layer having a substantially planar flex circuit buss bar disposed thereon, the buss bar for delivering power to the conductive layer thereby enabling the conductive layer to heat the liquid crystal display.

This invention will now be described with respect to certain embodiments thereof, accompanied by certain illustrations wherein:

IN THE DRAWINGS

FIG. 2(c) is a top elevational view of a flex circuit heater buss bar as originally manufactured according to the aforesaid embodiment of this invention.

FIG. 2(d) is a close-up fragmentary top elevational view of one end of the buss bar of FIG. 2(c).

FIG. 2(e) is a top elevational view of a buss bar according to the aforesaid embodiment of this invention after one end has been trimmed therefrom so as to prepare it for disposition on a corresponding conductive heating layer.

FIG. 2(f) is a top elevational view of a buss bar according to the aforesaid embodiment of this invention after one end has been trimmed therefrom so as to prepare it for deposition on a corresponding conductive heating layer.

FIG. 2(g) is a side elevational cross sectional view of the buss bar adhered to the display of the aforesaid embodiment of this invention.

FIG. 2(h) is a side elevational cross sectional view of the ring-shaped flex circuit of an embodiment of this invention including a temperature sensor embedded therein.

DETAILED DESCRIPTION OF CERTAIN EMBODIMENTS OF THIS INVENTION

Referring now more particularly to the accompanying drawings in which like numerals indicate like parts throughout the several views.

Figure 1:
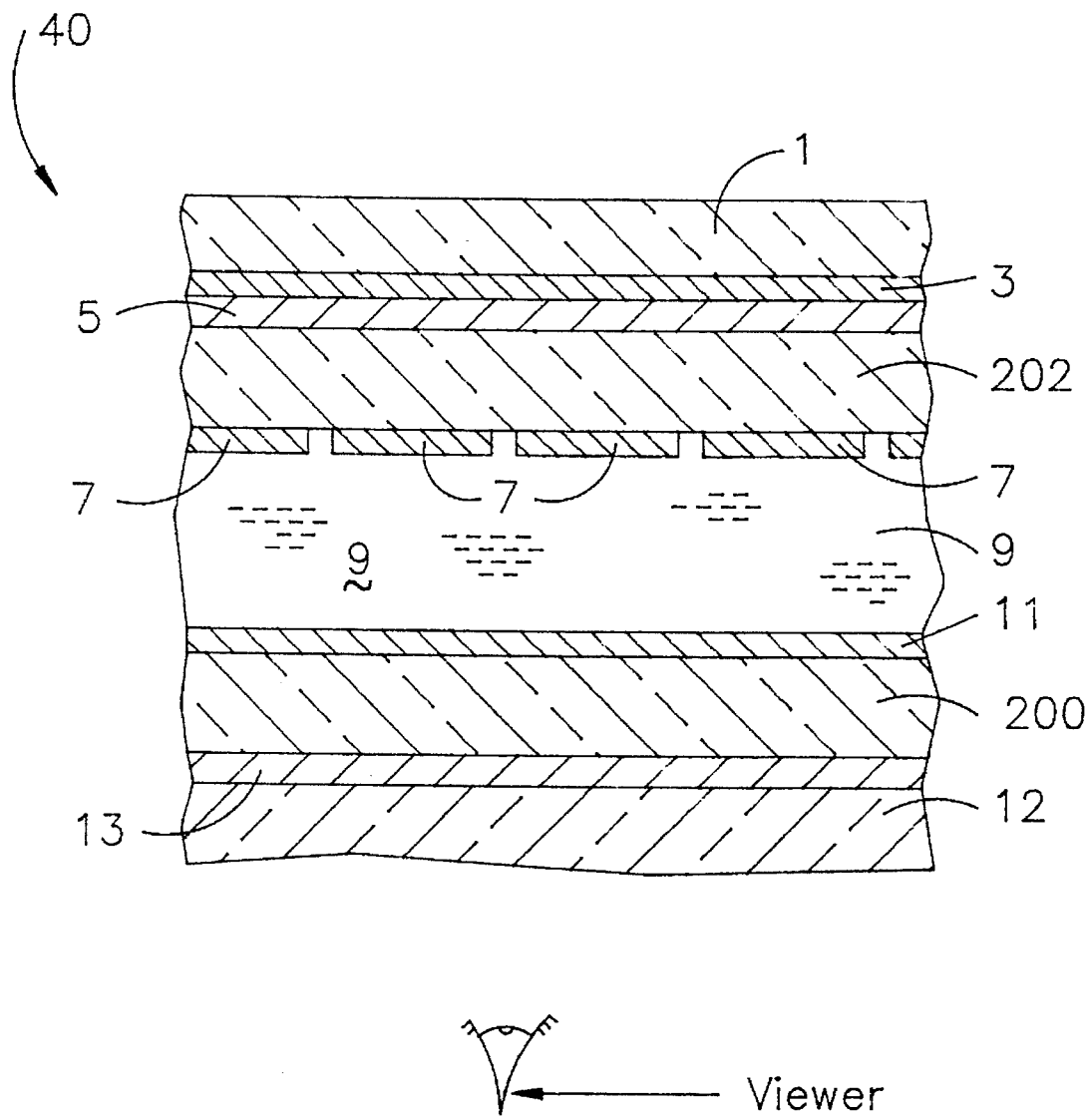
FIG. 1 is a side elevational cross-sectional view of a liquid crystal display including a heater according to an embodiment of this invention.

FIG. 1 is a side elevational cross-sectional view of a liquid crystal display according to an embodiment of this invention. The display includes from the rear forward toward the viewer, rear transparent glass cover sheet (i.e. substrate) 1, conductive heating layer 3 preferably made of substantially transparent indium-tin-oxide (ITO), rear polarizer 5, rear transparent glass substrate 202, individual pixel electrodes 7, liquid crystal layer 9, common electrode 11, front transparent glass substrate 200, front polarizer 13, and front cover sheet 12.

With reference now to FIGS. 1, 2(a), 2(b), and 2(g), conductive ITO layer 3 is first deposited onto transparent rear cover sheet 1 in a conventional manner, preferably via a vapor deposition process in which the ITO is disposed on glass sheet 1. Flex circuit buss bars 15 (not shown in FIG. 1 for purposes of simplicity) are then adhered to conductive ITO layer 3. A conventional conductive film such as "STAY-STIK 581" made by Alphametals may be used to adhere flex buss bars 15 to the interior planar surface of conductive ITO layer 3 in a preferred embodiment of this invention.

Each flex circuit buss bar 15 includes two integrally formed portions, elongated portion 16 which is adhered and substantially parallel to the interior planar surface of ITO layer 3, and tail or tang portion 76 which extends outward from the periphery of ITO layer 3 for the purpose of interfacing elongated portion 16 of flex buss bar 15 with a corresponding voltage source (not shown). Of course, one of flex circuit buss bars 15 is electrically connected to a voltage supply (i.e. positive) while the other flex buss bar 15 is connected to ground (i.e. negative) so as to allow transparent ITO layer 3 to heat up when a voltage/current is applied thereacross.

Each flex buss bar 15 adhered to ITO layer 3 is preferably less than about 0,005 inches thick, and most preferably less than about 0,003 inches thick. Accordingly, the combination of ITO layer 3, STAYSTIK adhesive, and buss bar 15 is about 0.005–0.008 inches thick in a preferred embodiment of this invention. However, the thickness of ITO layer 3 and the corresponding buss bars can be adjusted in accordance with the specific heating requirements of the heater assembly.

The relatively thin profile of flex circuit buss bars 15 allows heating ITO layer 3 to be directly adhered to the exterior surface of rear polarizer 5 using a conventional optical adhesive. Such a disposition of heating layer 3 including buss bars 15 adhered thereto directly or immediately adjacent rear polarizer 5 has heretofore not been practical due to the thick profiles of typical prior art buss bar electrical connections. Therefore, instead of adhering substrate 1 directly to the exterior planar surface of rear polarizer 5 and positioning ITO layer 3 exterior substrate 1, the use of flex circuit buss bars 15 allows the adherence of ITO layer 3 directly to the exterior (or interior) planar surface of rear polarizer 5 in a preferred embodiment of this invention. Buss bars 15 are disposed between ITO layer 3 and rear polarizer 5, with the conductive side of each buss bar facing the ITO layer.

The sandwiching of ITO layer 3 between rear polarizer 5 and transparent cover sheet 1 allows sheet 1 to thermally insulate ITO heater layer 3 from the outside environment thereby allowing more heat to be directed from ITO layer 3 inwardly toward liquid crystal layer 9. Also, by disposing ITO layer 3 closer to liquid crystal layer 9, the thermal resistance between heater layer 3 and liquid crystal layer 9 through which the heat generated by heater layer 3 must travel to reach the liquid crystal is reduced significantly. The result is a more efficient LCD heater in a display with reduced warm-up time.

Another advantage of flex circuit buss bars 15 over those of the prior art is that flex circuit buss bar tangs 76 extending from the periphery of ITO layer 3 are relatively easy to solder because, unlike prior art deposited metal buss bars, if the flex circuit is touched by solder, it will not burn out. Also, the flex buss bars allow the use of a variety of conventional electrical interconnect techniques (e.g. pin/socket, annular conductive pads held via screws, solder, etc.) for connecting the buss bar to the power source, or flex circuit 48.

Turning now to FIGS. 2(b)–2(g), each flex circuit buss bar 15 includes a base polyimide layer 17, preferably made of Kapton, with a conductive copper (Cu) trace layer 19 etched thereon in a preferred embodiment of this invention. Copper trace layer 19 in FIGS. 2(c) –2(f) is illustrated in black. Copper layer 19 is, of course, sandwiched between heating ITO layer 3 and Kapton or base layer 17 so as to be conductively in contact with the ITO layer via the conductive adhesive, as shown in FIG. 2(g). In a preferred embodiment of this invention, Kapton base layer 17 of each buss bar 15 is about 3–4 mm wide along each elongated portion 16 and about 7.5 mm–9.0 mm wide along each tang portion 76, while copper trace layer 19 is about 2–3 mm wide throughout its entire length. The width (and thickness) of copper layer 19 may, of course, vary in accordance with the current/voltage requirements of the heater, adhesive, and corresponding display assembly. Buss bar layers 17 and 19 may, of course, be made of any other suitable material.

Tang portions 76 of flex circuit buss bars 15 extend beyond the periphery of ITO layer 3 and are manufactured accordingly. Each tang 76 includes, of course, base Kapton layer 17 and copper trace layer 19, but also has cover layer 21 provided thereon, preferably made of Kapton. Cover layer 21 acts to protect copper trace layer 19 as it extends beyond the periphery of ITO layer 3 and is bent orthogonally (i.e. about 90°) relative thereto. As shown, tangs 76 are also bent about 45° relative to elongated portions 16 within the plane of the elongated portions so that they may protrude from the beveled corners of ITO layer 3 and cover layer 1.

Figure 2A:
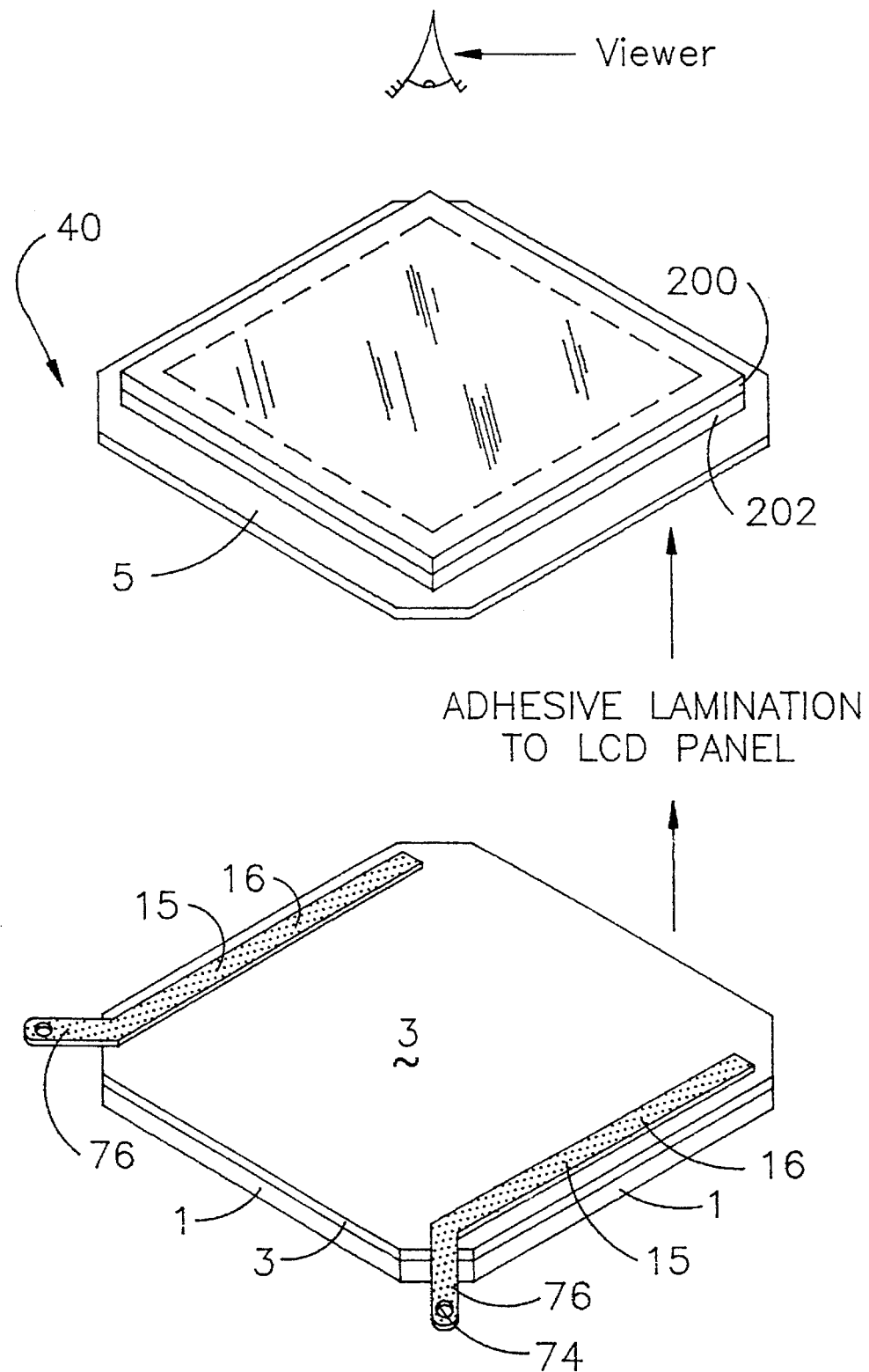
FIG. 2(a) is an exploded perspective view of a heater assembly and corresponding display according to the embodiment of this invention shown in FIG. 1.
Figure 2B:
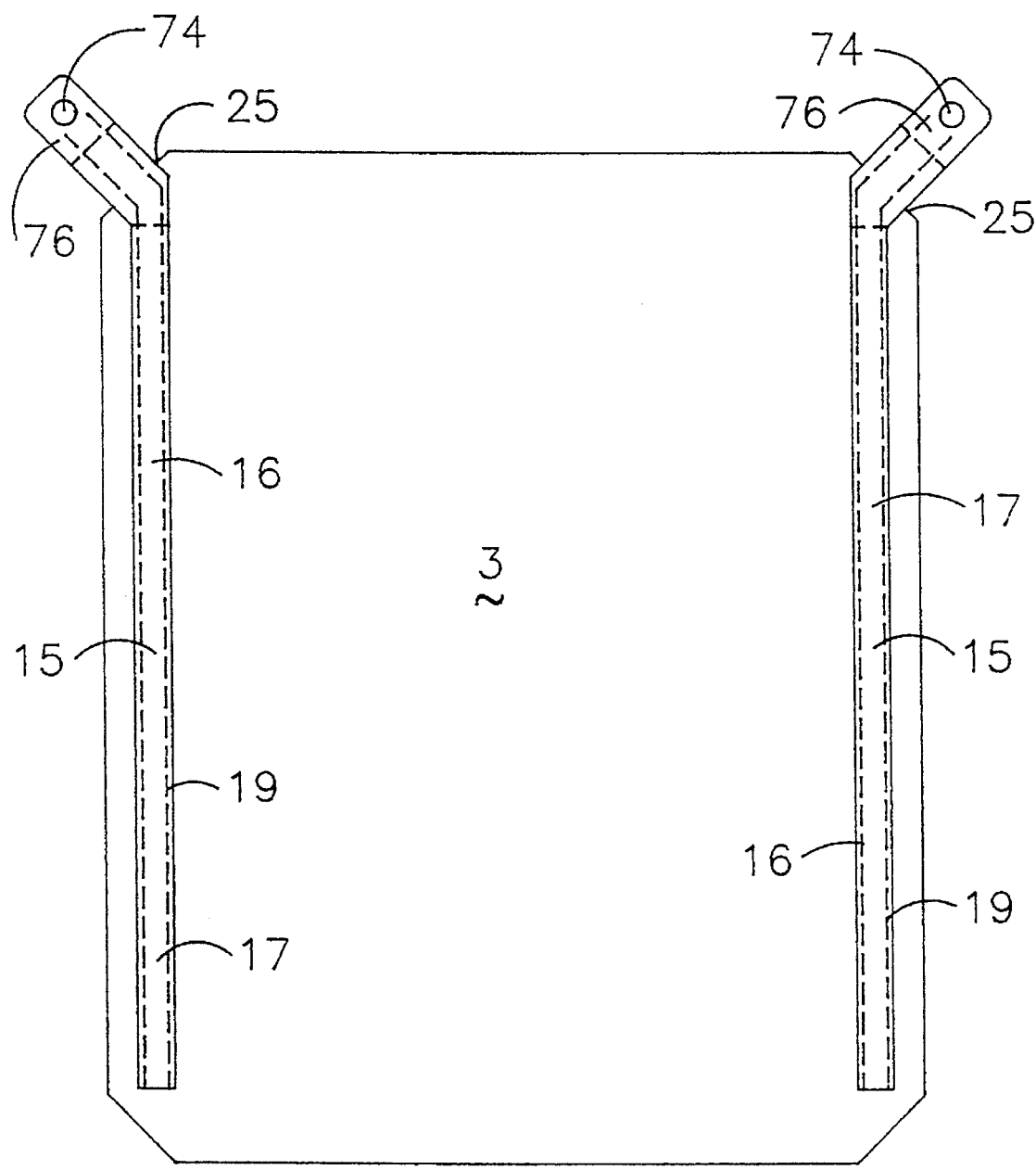
FIG. 2(b) is a top elevational view of the conductive heating layer of FIG. 2(a) with its pair of flex circuit buss bars provided thereon.

Each flex buss bar 15 is originally manufactured, as shown in FIG. 2(c), so as to include longitudinal portion 16 and two tail or tang portions 76, one on each longitudinal end of elongated portion 16. Upon receiving the originally manufactured flex buss bar 15 shown in FIG. 2(c), the manufacturer trims a tang 76 therefrom in accordance with whether the flex buss bar is to be mounted on the left or right side (i.e. ground or hot side) of ITO layer 3. Such buss bars 15 with a single tang 76 trimmed therefrom are illustrated in FIGS. 2(e) and 2(f), with the FIG. 2(e) buss bar 15 to be adhered to the left side of ITO layer 3 as shown in FIG. 2(b), and the FIG. 2(f) buss bar 15 to be adhered to the right side of ITO layer 3 as shown in FIG. 2(b), with, of course, copper 19 conductively contacting ITO 3.

Figure 3:
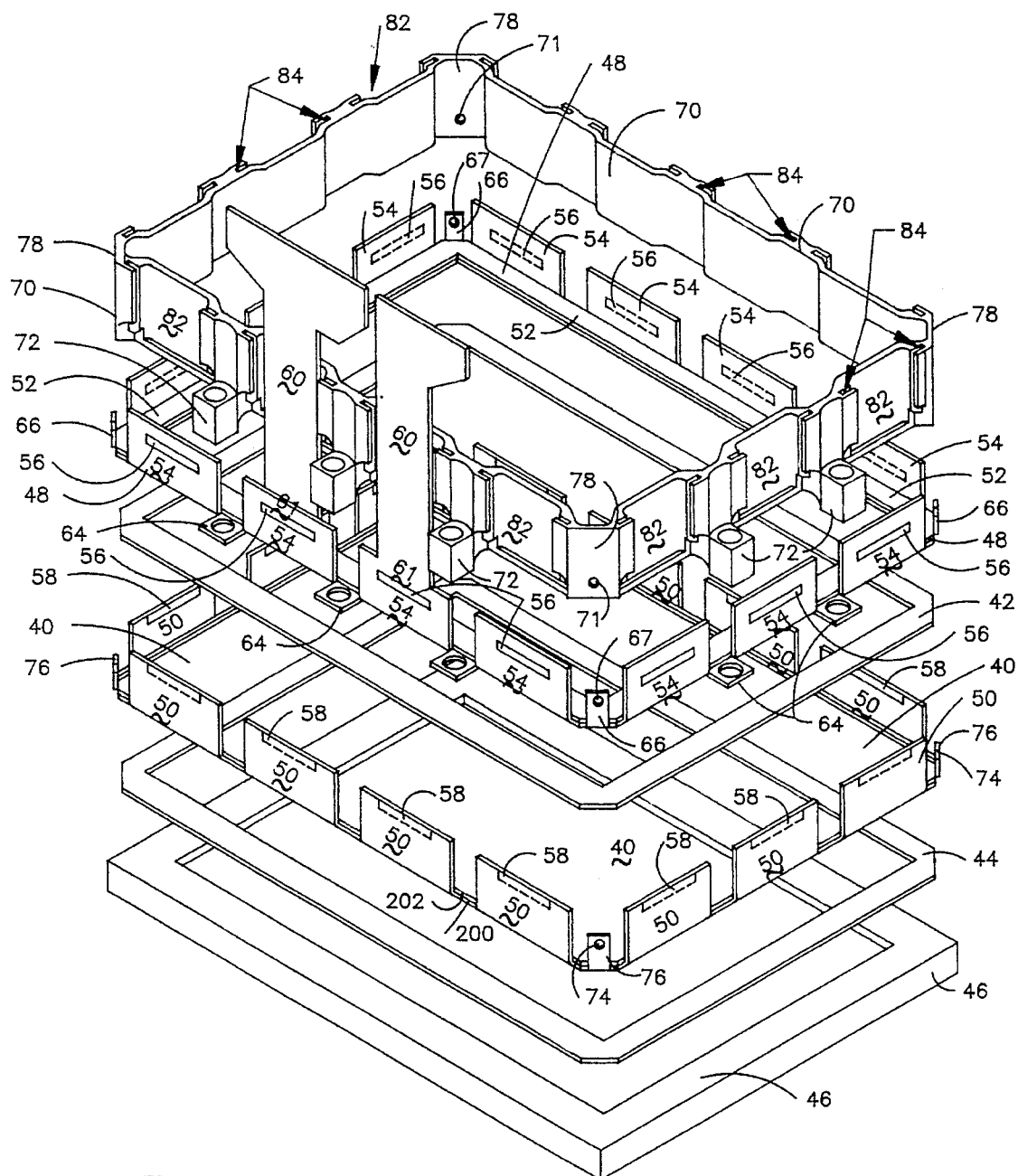
FIG. 3 is an exploded perspective view of an AMLCD assembly including the aforesaid heater and display panel according to an embodiment of this invention.
Figure 4:
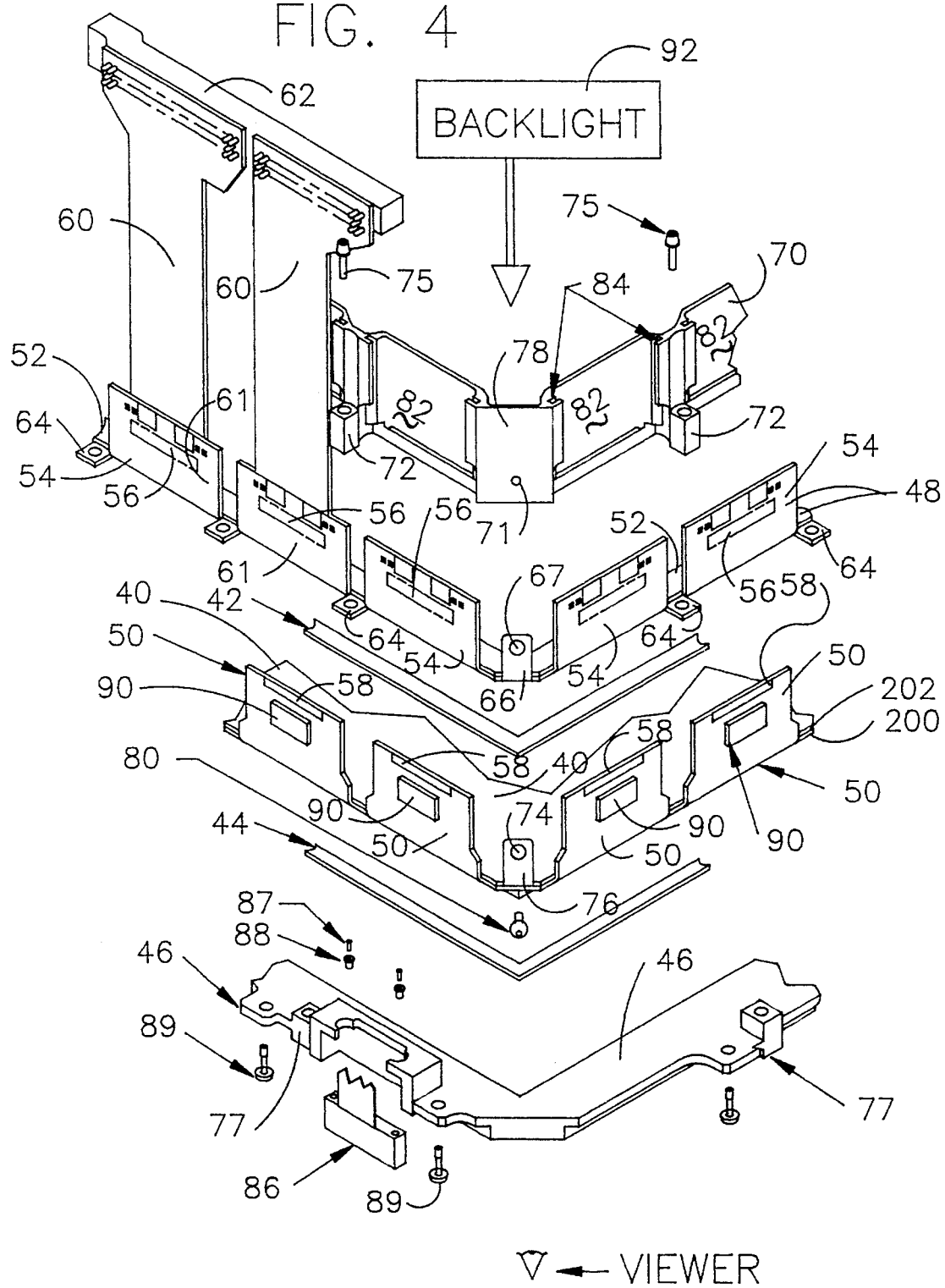
FIG. 4 is an exploded perspective view illustrating one-quarter of the AMLCD assembly embodiment shown in FIG. 3.
Figure 5:
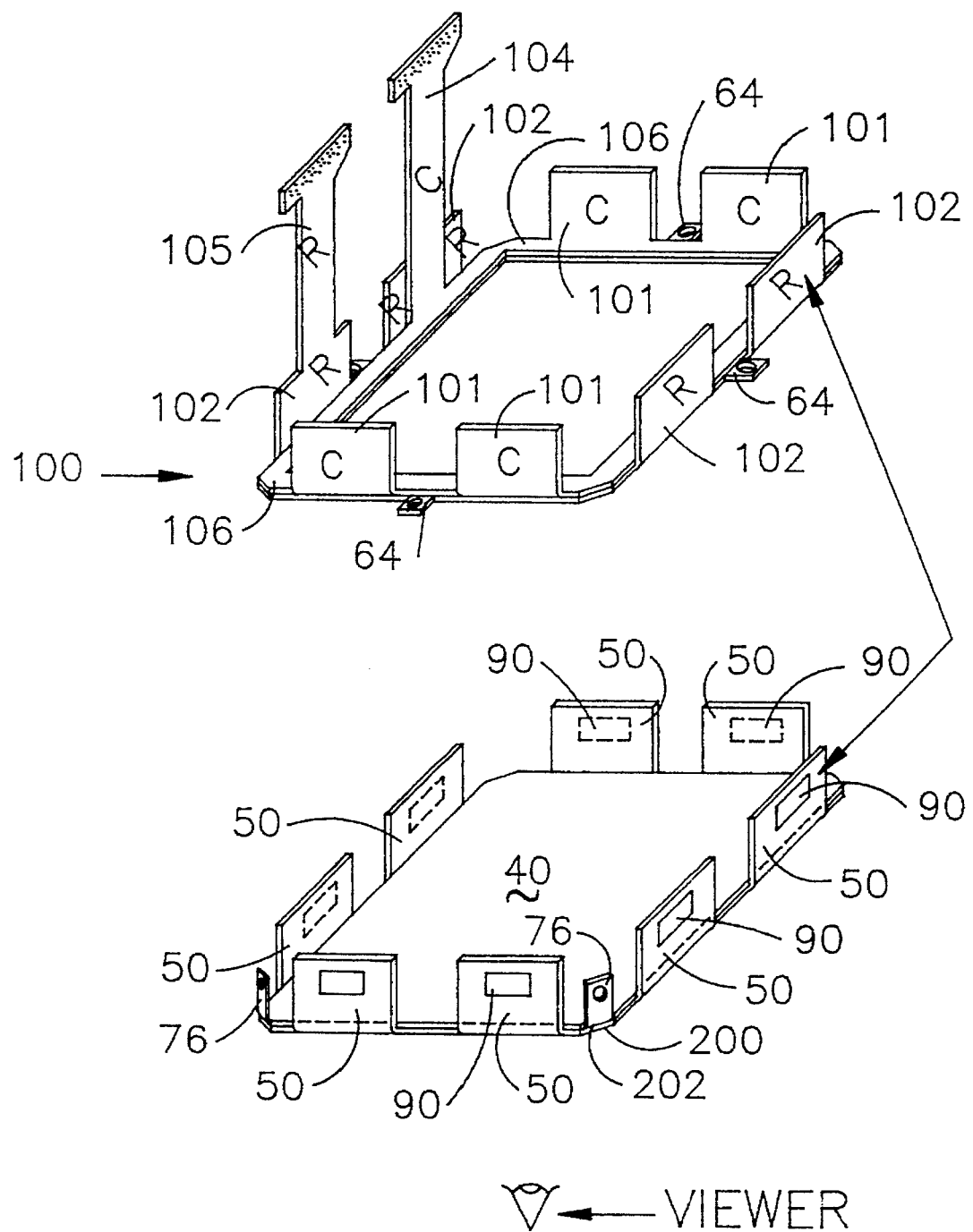
FIG. 5 is an exploded perspective view illustrating the ring-shaped flex circuit and the active matrix liquid crystal display panel of another embodiment of this invention.

With reference to FIGS. 2(a), 2(b), 3, 4, and 5, tang portions 76 of buss bars 15 are bent orthogonally (i.e. about 90 degrees) relative to the planar surface of ITO layer 3 as they extend outwardly from the ITO layer (and display panel 40) periphery. Reference numeral 25 generally indicates the point at which tangs 76 are bent in such a manner. After tangs 76 of buss bars 15 are bent about 90° relative to ITO layer 3 and display panel 40, they are fixedly and conductively attached to corresponding tangs 66 integrally formed with ring-shaped flex circuit 48. Copper trace(s) disposed on ring-shaped flex circuit 48 and tangs 66 thereof provide power to tangs 76 and buss bars 15 adhered to ITO layer 3. Tangs 76 are electrically affixed to ring-shaped flex circuit tangs 66 as by apertures 74, 67, and 71 receiving a conventional conductive fastener (e.g. screw) therein. The detailed descriptions of FIGS. 3–5 provided below more fully describes the display assembly of FIGS. 3–5.

As shown in FIGS. 2(g)–2 (h), conventional AD590 analog IC temperature sensor 29 (see FIGS. 2(g), 2(h), and 6) is embedded within ring-shaped flex circuit 48 (or 100) so as to contact the exterior planar surface of cover sheet 1 when ring-shaped flex circuit 48 is disposed adjacent thereto in accordance with the below discussed teachings of this invention. IC temperature sensor 29 outputs a temperature reading of the display panel as a function of amperes (current). This output dictates/instructs when ITO layer 3 is to be energized so as to heat or warm up the LCD, the display output controller (see FIG. 6), of course, receiving the IC sensor output and selectively energizing ITO layer 3 in accordance therewith by way of buss bars 15. While IC sensor 29 is embedded within ring-shaped flex circuit 48 (or 100) of each embodiment of this invention, it is only shown in FIGS. 2(g), 2(h), and 6 for purposes of simplicity.

Gasket 42 is sandwiched between cover sheet 1 and flex circuit 48 as shown in FIG. 2(g). Gasket 42 has a notch formed therein so that sensor 29 can protrude therethrough and contact cover sheet 1.

Figure 2J:
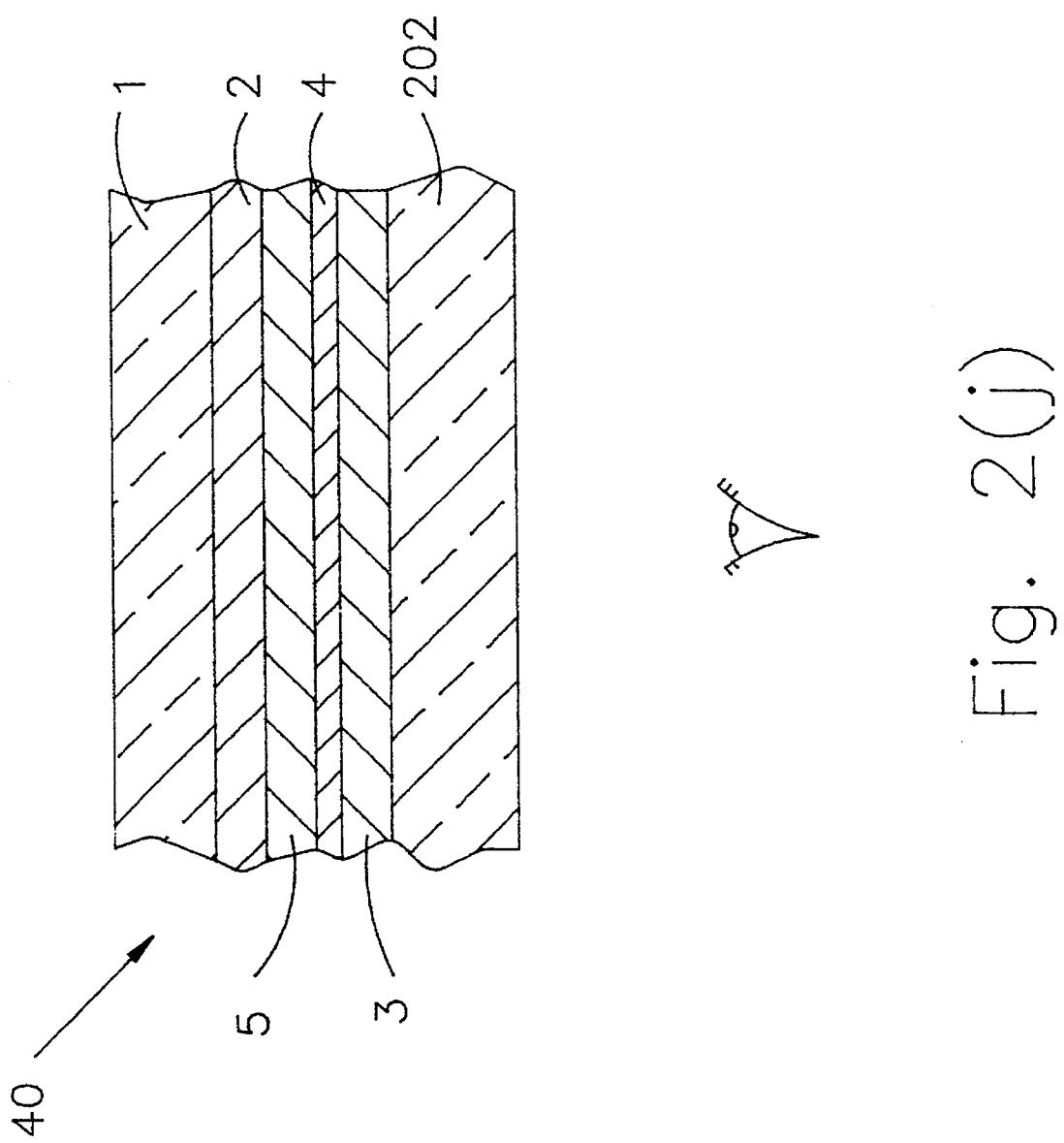
FIG. 2(j) is a side elevational cross sectional view of a LCD including a heater according to another embodiment of this invention.

FIG. 2(j) illustrates another embodiment of this invention wherein ITO heater layer 3 is disposed adjacent the interior surface of rear polarizer 5. This embodiment includes from the rear forward toward the viewer cover sheet 1, conventional optical adhesive layer 2, rear polarizer 5, conventional polarizer adhesive 4, ITO layer 3, and substrate 202. This embodiment even further reduces the displays'warm-up period because ITO heating layer 3 is closer to the liquid crystal layer disposed interior of substrate 202.

FIGS. 3–4 are exploded perspective views of an AMLCD assembly including the aforesaid heater according to an embodiment of this invention. Planar active matrix liquid crystal display panel 40 including a matrix array of pixels is disposed between panel gaskets 42 and 44. Display panel 40 includes first and second transparent glass (or plastic) substrates 200 and 202 (see FIG. 4) sandwiching liquid crystal layer 9 therebetween. Panel 40 also includes cover sheet 1, ITO layer 3, buss bars 15, etc., all of which are not shown in FIGS. 3–5 for purposes of simplicity. The plurality of pixels (see FIG. 1) disposed in panel 40 each have opposing electrodes 7 and 11 on opposite sides of the liquid crystal material. Electrodes 7 and 11 along with liquid crystal layer 9 are shown in FIG. 1. The opposing electrodes of each pixel are selectively energized so as to apply a voltage across liquid crystal material 9. Any type of known pixel construction can be used in accordance with this invention, preferably with the liquid crystal layer thickness provided so as to meet/match the first transmission minimum, as taught by Gooch-Tarry.

Display panel 40 includes a plurality of row and column address lines (not shown for purposes of simplicity) for selectively activating the individual pixels. Furthermore, for purposes of simplicity of illustration, display panel 40 is shown in FIG. 3 as being completely transparent. In reality, this is not the case as illustrated in FIG. 4.

Typical row and column address lines and corresponding pixels disposed in panel 40 are described, for example, in U.S. Pa. Nos. 4,728,802, 5,003,356, and 5,193,018, the disclosures of which are hereby incorporated herein by reference. The aforesaid patents also describe conventional active matrix driving circuitry disposed in the panel, such as conventional switching TFTs or diodes, each of which may be used to selectively apply the voltage across the liquid crystal material of each pixel in accordance with commands generated by a display output controller (not shown).

Retainer bracket 46 is mounted on the viewer side of display panel 40 with gasket 44 disposed between display panel 40 and retainer bracket 46. The inner peripheries of gasket 44 and bracket 46 define a viewing area of panel 40 through which light emitted from a conventional backlight (not shown) is selectively permitted to pass. Retainer bracket 46 protects the active matrix liquid crystal display assembly from the outer environment and is the element of the display assembly closest to the viewer.

Display panel 40 has a plurality of driver TABS (tape automated bonding, hereinafter "tabs") 50 mounted thereto, each of which includes a plurality of conductive output traces disposed thereon to be electrically connected to the row and column address lines of AMLCD panel 40. Panel 40 of this embodiment has fourteen separate and distinct driver tabs 50 mounted thereto, four along each of two opposing peripheral sides, and three mounted along the other two peripheral sides. Each driver tab 50 is preferably connected to approximately one to two hundred row or column address lines disposed in display panel 40.

The row and column address lines of panel 40 are both preferably interdigitated in that they extend laterally to opposing peripheral edges or sides of display panel 40 where they are electrically connected to output contacts (not shown) of driver tabs 50.

Ring-shaped flex circuit 48 is mounted along the periphery of the interior or rear planar surface of display panel 40 with gasket 42 including its sensor notch disposed therebetween. The purpose of ring-shaped flex circuit 48 is to interface all row and column address lines disposed in display panel 40 with a conventional central display output controller (see FIG. 6) which selectively controls the image output by the AMLCD panel pixels.

Ring-shaped flex circuit 48 of this embodiment is composed of two separate planar flex sheets laminated together (not shown). One of the planar sheets has conductive traces disposed thereon which are to be electrically interfaced with the panel row address lines, and the other planar sheet includes similar traces which are to be electrically interfaced with the panel column address lines, both by way of driver tabs 50.

Ring-shaped flex circuit 48 includes ring or annular portion 52 which defines a plane substantially parallel to the plane of display panel 40. Ring portion 52 of ring-shaped flex circuit 48 is mounted adjacent all four peripheral sides of display panel 40 and defines a viewing area through which light from a backlight source (not shown) is selectively permitted to pass in order that it may be viewed by a viewer. Flex circuit 48 also includes a plurality of extension members 54 which extend orthogonally with respect to ring portion 52. Ring and extension portions 52 and 54 are originally formed as a planar sheet, with extensions 54 thereafter being orthogonally (i.e. about 90°) bent with respect to ring portion 52. The planar nature of ring portion 52 allows an increased (substantially unlimited) number of conductive trace layers to be stacked thereon thus enabling ring-shaped flex circuit 48 to address AMLCDs of various resolutions.

Each flexible extension member 54 has an output contact area 56 disposed on its exterior surface for interfacing with input contact areas 58 disposed on driver tabs 50. The conductive input traces (not shown) disposed on driver tabs 50 are electrically connected to the conductive output traces (not shown) of ring-shaped flex circuit 48 by way of electrical connection between contact areas or pads 56 and 58 on each extension member 54 and corresponding driver tab 50, respectively. Each extension member 54 has a plurality of conductive output traces thereon extending from the contact area 56 to ring portion 52. Ring portion 52 of ring-shaped flex circuit 48 is essentially a conductive trace highway having a plurality of copper traces along with sensor 29 disposed thereon, preferably in a plurality of layers (e.g. six to eight), which extend from the different extension members 54 to tail connectors 60.

Ring-shaped flex circuit 48 includes two sheets laminated together, each sheet having a base layer of Kapton (i.e. a dielectric), a polyimide, upon which a layer of rolled annealed copper (Cu) is disposed. The copper is chemically etched to form a plurality of copper traces on the base Kapton layer. A conventional acrylic or epoxy adhesive is layered on the aforesaid first copper trace layer. Thereafter, a second Kapton layer (i.e. cover layer) is disposed on the ring-shaped flex circuit sheet, the second Kapton layer for mounting a second layer of copper conductive traces. Up to about 18 or more of these trace layers (Cu traces with Kapton supports) may be laminated onto each ring-shaped flex circuit sheet in such a manner. After all of the copper trace layers have been deposited, a polyimide cover layer is adhered via a known epoxy or acrylic adhesive to the top of the layered ring-shaped flex circuit sheet, the cover layer defining apertures therein at locations corresponding to the flex circuit output pads. The exposed copper traces/leads within these apertures are covered, for example, with nickel (Ni) and gold, or solder plating in a conventional manner.

Tail connectors 60 extend outwardly (i.e. away from display panel 40) from two extension members 61 in this embodiment so as to allow the conductive traces disposed on ring-shaped flex circuit 48 to be interfaced with the display output controller by way of main connector 62 mounted to the outward longitudinal ends of tail connectors 60. Preferably, one of tail connectors 60 has all of the row address line conductive traces disposed thereon, while the other tail connector 60 supports conductive traces for interfacing all of the column address lines of AMLCD panel 40.

Tail 60 including the row traces is, of course, integrally formed with the ring-shaped flex circuit sheet having the row circuitry thereon, while the other tail 60 (i.e. column tail 60) is integrally formed with the column sheet. The two sheets, as discussed above, are then laminated together so as to form ring-shaped flex circuit 48. The longitudinal end of each tail connector 60 disposed furthest away from ring-shaped flex circuit 48 is connected to main connector 62 which is electrically disposed between the display output controller and tail connectors 60.

Each ring-shaped flex circuit sheet preferably includes a fiberglass stiffening member adhered to both the ring portion and the extensions of that sheet. The junctions between extensions 54 and ring portion 52 are preferably free of stiffeners so as to allow the extensions to be bent orthogonally (i.e. about 90°) with respect to ring portion 52. The two fiberglasses preferably used as stiffeners are known in the art as FR4 and G10. The shapes of the stiffening members roughly correspond to the size and peripheries of the ring and extension portions of the ring-shaped flex circuit sheets.

Figure 6:
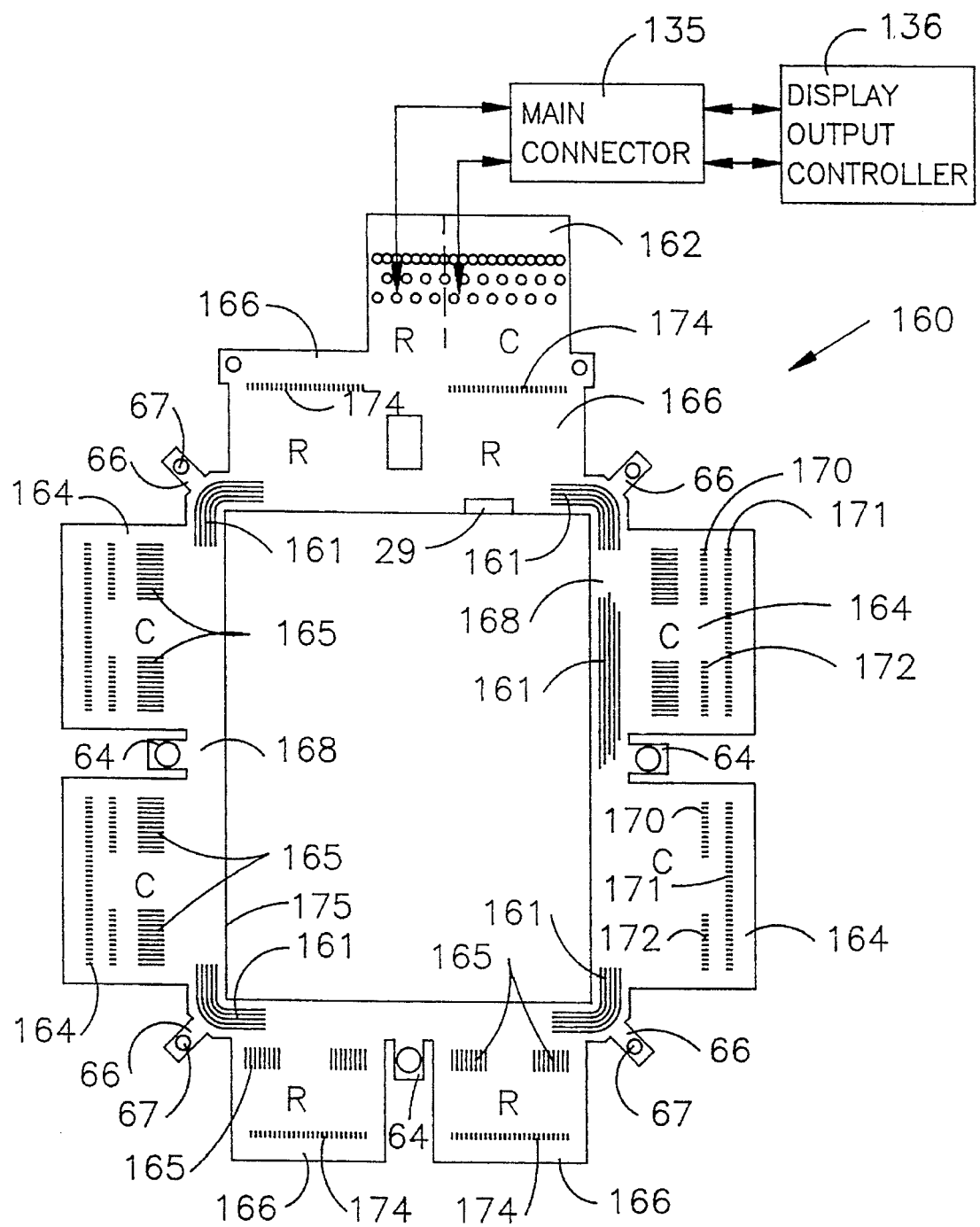
FIG. 6 is a top elevational view of a ring-shaped flex circuit of another embodiment of this invention, including the temperature sensor embedded therein and before the extensions thereof are orthogonally bent relative to the ring portion.

While the conductive copper traces disposed on ring portion 52 of ring-shaped flex circuit 48 are not shown in FIGS. 3-4 for purposes of simplicity, they extend longitudinally along all four sides of ring portion 52 and are connected between adjacent sides via the four corners of ring portion 52 as shown, for example, in FIG. 6 by reference numeral 161.

Addressing flex circuit 48 includes a plurality of mounting tangs 64 extending radially outward from ring portion 52 so as to allow flex circuit 48 (and gasket 42) to be compression mounted on display panel 40 between retainer housing 46 and extension receiver housing 70. Tangs 64 extending from ring portion 52 are sandwiched between mounting members 72 and 77 (see FIG. 4) disposed on extension receiver housing 70 and retainer housing 46 respectively. Screws or fasteners 75 extend through and connect mounting members 72, tangs 64, and mounting members 77 thereby compression mounting retainer housing 46, gasket 44, display panel 40, gasket 42, flex circuit 48 (including sensor 29), and extension receiver housing 70. The compression between the aforesaid elements created by fasteners 75 creates a stable and efficient unit made up of the aforesaid AMLCD assembly elements. A second function of fasteners or screws 75 and tangs 64 is to provide grounding points disposed between the flex circuit extension members 54 in order to meet EMI grounding requirements.

Ring-shaped addressing flex circuit 48 of this embodiment further includes four (or alternatively two corresponding to the two buss bars) corner tangs 66 integrally formed with and extending orthogonally with respect to ring portion 52 at each of the four corners of flex circuit 48. Tangs 66 may be integrally formed with either the row sheet or the column sheet. Corner tangs 66 allow the corners of flex circuit 48 to be affixed to the four corners of extension receiver housing 70, and at least two corner-disposed heater buss bar flex tangs 76 via screw or fastener apertures 71 and 74 defined in the receiver housing 70 and buss bar flex tangs 76 respectively. Apertures 74 in heater buss bars 15 are connected to display panel 40 as by flex circuit buss bar corner tangs 76 extending orthogonally away from the planar surface of display panel 40, including ITO layer 3, preferably at two of the four corners thereof.

Although the embodiment of FIG. 3 illustrates four tangs 76, one at each corner, only two of these four tangs 76 are part of heater buss bars 15. The other two are provided for mounting purposes. Flex circuit buss bar tangs 76 are preferably made of a single polyimide (e.g. Kapton) layer with a copper trace chemically etched thereon. Two of the four flex corner tangs 76 of the FIG. 3 embodiment are integral extension portions of heater buss bars 15 as discussed previously, each buss bar 15 being adhered to ITO layer 3 formed on transparent glass cover sheet 1, wherein ITO heating layer 3 is disposed immediately adjacent the exterior surface of display panel polarizer 5. ITO layer 3 within panel 40 is heated/powered by current passed through buss bars 15 by way of flex circuit tangs 76 and 66.

Apertures 71 of CNC-milled extension receiver housing 70 are defined in beveled corner areas 78 of receiver housing 70. Beveled corner areas 78 (and corresponding beveled corners of the display panel, ring-shaped flex circuit, ITO layer, cover sheet, and retainer housing) reduce the overall size of the AMLCD assembly. Mounting screws 80 (see FIG. 4) fit through apertures 74, 67, and 71 in the corner mounting areas of buss bar tangs 76, flex circuit 48, and receiver housing 70, respectively, thereby providing a stabilized mounting at the corner areas of the aforesaid elements. Like grounding tangs 64, corner tangs 66 of flex circuit 48 also act as grounding points, except for the tang 66 affixed to the hot or positive buss bar tang 76.

Extension receiver housing 70 includes a plurality of receiving portions 82 which slidably receive each of extension members 54 of ring-shaped flex circuit 48. Each receiving portion 82 receives a corresponding extension member 54 in opposing grooves 84 disposed on either side of the receiver portion. The lateral edges of extension members 54 slidingly fit into opposing grooves 84 defined by receiving portions 82, thereby sustaining the orthogonal relation of extensions 54 relative to ring portion 52. As shown, grooves 84 and receiving portions 82 are preferably formed in the exterior surface of receiver housing 70. After extensions have been received in grooves 84, driver tabs 50 are bent orthogonally with respect to display panel 40 and are connected to extensions 54 via gold welds or solder joints at output pads 56. In other words, the lateral edges of driver tabs 50 preferably are not received in grooves 84, and output pads 56 of extensions 54 are welded or soldered to input pads 58 of tabs 50. Because driver tabs 50 are not received in grooves 84, the width of each tab 50 is slightly less than the width of each corresponding extension 54.

Alternatively, although not in the preferred embodiment, the lateral edges of driver tabs 50 could be dimensioned so as to slidingly fit into receiving grooves 84.

In this embodiment, because active matrix display panel 40 is provided with 14 separate driver tabs (four on two sides and three on the other two sides), ring-shaped flex circuit 48 is provided with fourteen corresponding extension members 54 for electrical connection to driver tabs 50 while aluminum receiver housing 70 is accordingly provided with fourteen separate receiving portions 82 for slidably receiving extension members 54.

Receiving grooves 84 defined in receiver housing 70 eliminate the prior art need for expensive mounting hardware such as screws, bolts, etc. and simplify the mounting of flexible driver tabs 50 and extension members 54.

CNC-milled receiver housing 70, preferably made of aluminum, is mounted on the interior or rear planar surface of ring portion 52 thereby compressing ring-shaped flex circuit 48 and display panel 40 between retainer housing 46 and extension receiving housing 70.

The beveled corner areas of receiver housing 70, flex circuit 48, and display panel 40 allow the AMLCD assembly of this embodiment to be mounted in boxes having chamfered edges. Such boxes are often present in cockpits of air vehicles. As a result of the design of this AMLCD assembly, cockpit mounted displays (not having beveled corner areas) in such boxes can be replaced with larger and higher resolution displays in accordance with this invention.

Retainer housing 46, disposed on the exterior or front side of display panel 40, protects the viewer side of the display and defines the viewing area thereof. As shown in FIG. 4, AMLCD assembly cable bezel 86 supplies signals to a keypad disposed, for example, in the cockpit of an aircraft, so that the pilot can interface with the electronics of the AMLCD. Cable bezel 86 is mounted via retaining fasteners 87 and 88, while retainer housing 46 is mounted by way of fasteners 89 to a chamfered corner box (not shown) which houses the entire AMLCD assembly.

FIG. 4 illustrates a driver chip or die 90 mounted on each driver tab 50. The purpose of flex circuit 48 is to provide power to the plurality of driver chips 90 mounted around the perimeter of display panel 40. Each driver chip 90 or die is preferably made of silicon and includes layer upon layer of electronics in a microminiature scale. Conductive input leads (not shown) disposed on driver tabs 50 electrically connect driver chips 90 to input contact rows or pads 58 which are to be interfaced with output contact pads 56 of extension members 54. The input contact pad 58 of each driver tab serves as an input for allowing signals from the display output controller (not shown) to reach driver chip 90. Each driver tab 50 has an output pad or contact row disposed thereon which is bonded to display panel 40 for electrical connection between the address lines of AMLCD panel 40 and the output leads of the driver tab.

In a typical operation of the AMLCD assembly, except for the heater aspect thereof, of this embodiment, the conventional display output controller (not shown, see FIG. 6) generates a signal for selectively controlling the energization of various pixels in display panel 40. The controller output signal, having row address line data and column address line data, is transmitted to main connector 62. The signals relating to the row address lines of the display panel are directed from main connector 62 down one of tail connectors 60 while the data relating to the column address lines of AMLCD panel 40 are transmitted through the other tail connector 60. Accordingly, one tail connector 60 inputs all row address line data into ring-shaped flex circuit 48 while the other tail 60 inputs all column signals to the conductive copper traces of flex circuit 48. This data is transmitted through tail connectors 60 to layers of conductive traces (not shown) disposed on ring portion 52 of the ring-shaped flex circuit. The conductive traces on ring portion 52 of flex circuit 48 are preferably made of copper and may include approximately one to eighteen trace layers (preferably six to eight) laminated on top of one another.

The signals from the controller, having reached the conductive traces on ring portion 52 of flex circuit 48, are routed to their destined extension members 54, each of which has a plurality of conductive copper traces thereon for allowing the signals to reach flex circuit output contact rows or pads 56 from ring portion 52. The data signals are then electrically communicated from flex circuit output contact pads 56 of extension members 54 to driver tab input contact pads or rows 58. The data signals, upon reaching input contact rows 58, proceed therefrom via copper input traces to driver chips 90 disposed on driver tabs 50. After receiving the instructional data signal from the controller, driver chips 90 output control signals through a plurality of output leads which are connected, by way of an output contact row, to the row and column address lines of display panel 40.

By selectively energizing predetermined row and column address lines of the AMLCD panel, specific pixels in the matrix array are activated thus providing an illumination or image signal to the viewer. The address lines which are energized communicate with, for example, TFTs associated with each pixel in the array. The TFTs act as switching elements for selectively allowing a voltage to be applied across liquid crystal material 9 via opposing electrodes 7 and 11. In a normally black pixel, for example, when a voltage is applied across the liquid crystal material and radiation from backlight 92 is directed toward the display, the liquid crystal material transmits the radiation or light therethrough allowing it to reach the viewer. Otherwise, the normally black pixel appears darkened to the viewer when a voltage less than the threshold voltage is applied across the LC material. Selective activation of specific pixels allows different images to be transmitted to the viewer. The ring-shaped flex circuit designs of the various embodiments of this invention may, of course, be used in conjunction with both normally white and normally black display panels (and pixels).

In a typical operation of the heater aspect of this embodiment, conventional analog IC temperature sensor 29 embedded within ring portion 52 (or 100) immediately adjacent so as to contact cover sheet 1 through a notch in gasket 42 first determines the temperature of the display panel. The IC sensor outputs this temperature as a function of current by way of corresponding copper traces etched on ring portion 52. This temperature data is transmitted through ring portion 52, up tail 60, and finally to the display output controller by way of main connector 62.

If, upon receiving the temperature data from IC sensor 29, the controller determines that the panel is not warm enough for proper liquid crystal operation, the controller outputs a heating signal for energizing ITO layer 3. This heating signal flows through main connector 62, tail 60, and into ring portion 52 of flex circuit 48 by way of the aforedescribed copper traces. The heating signal, once reaching ring portion 52, is transmitted through the trace(s) of tang 66 to copper trace 19 etched on buss bar tang 76. The energizing signal then flows through copper trace 19 along the length of buss bar 15 thereby allowing ITO layer 3 to be energized so as to heat the display. Because one buss bar 15 is grounded and the other is "hot," current is allowed to flow across ITO layer 3 which results in the heating thereof. When the IC sensor finally outputs a satisfactory temperature reading to the controller, the controller deenergizes the ITO layer by cutting off the current flow to the "hot" buss bar.

FIG. 5 is an exploded perspective view of another embodiment of this invention. The principal difference between this embodiment and the previous embodiment of this invention is that this embodiment illustrates a smaller AMLCD assembly having only eight driver tabs mounted to display panel 40.

As in the previously described embodiment of this invention, each driver tab 50 is connected to display panel 40 adjacent a peripheral side of the panel. After being connected to the front planar surface of panel 40, flexible driver tabs 50 are bent around the periphery of panel 40 so as to extend orthogonally inward from the plane defined by the display panel. In this manner, output contact rows of the driver tabs are connected to the row and column address lines along the peripheral sides of display panel 40.

Because the AMLCD of this embodiment only requires eight driver tabs 50, ring-shaped flex circuit 100 is provided with just eight corresponding extension members 101, 102. Column extensions 101 of flex circuit 100 include conductive traces disposed thereon which accommodate the column data signals sent from the controller to display panel 40. Accordingly, row extension members 102 are provided with copper traces which transmit the row signals being sent from the controller to the display panel by way of driver tabs 50.

FIG. 5 illustrates how ring-shaped flex circuit 100 includes two planar sheets ("C" and "R") laminated to one another, one sheet "C" having traces thereon for transmitting the column data and the other "R" having traces for accommodating the row data. As in the previous embodiment, each sheet includes a complete ring portion, a plurality of extensions, and a tail. As can be seen, tail connector 104 which transmits the column addressing data is laminated over top of a row extension member 102 while row tail connector 105 is integrally formed with one of the row extension members 102 and row sheet "R". The row and column sheets making up ring-shaped flex circuit 100 are, as in the first embodiment, laminated to one another along ring portion 106 of flex circuit 100. A fiberglass stiffening member (not shown) is preferably provided along ring portion 106 (and optionally the extensions) of flex circuit 100 so as to increase its durability.

As in the first embodiment, driver chips 90 disposed on driver tabs 50 are electrically interfaced with output contact pads (not shown) disposed on the extension members of flex circuit 100. Although not shown for purposes of simplicity, the display assembly of this embodiment is also provided with an aluminum extension receiver housing on the side of flex circuit 100 opposite the viewer. Accordingly, flex circuit 100 and display panel 40 of this embodiment are to be assembled and operate as described above with respect to the first embodiment of this invention.

FIG. 6 is a top view of a ring-shaped addressing flex circuit 160 according to another embodiment of this invention. This figure illustrates flex circuit 160 in its planar form before extension members 164 and 166 are orthogonally bent with respect to ring portion 168. Flex circuit 160 is made of a single sheet including both row and column conductive copper addressing traces 161 etched thereon. Flex circuit 160 has a single tail connector 162 which interfaces both the row and column traces of flex circuit 160 with main connector 135 and display output controller 136. Controller 136, of course, includes a voltage source for energizing ITO layer 3 via buss bars 15. As in the previously described embodiments of this invention, ring portion 168 of flex circuit 160 has a plurality of copper traces 161 etched thereon while row and column extensions 166 and 164 have corresponding traces 165 also etched thereon.

As can be seen, the AMLCD panel (not shown) to be interfaced with controller 136 by flex circuit 160 of this embodiment has a greater amount of column driver chip functionality (as opposed to row chip functionality). Therefore, each column extension member 164 includes three separate output contact rows 170–172 while row extensions 166 have only one output contact row 174. The three output contact rows 170–172 of each column extension member 164 are electrically connected to three corresponding input contact rows (not shown) defined on each adjacent driver tab. This electrical connection between contact rows 170–172 of column extension members 164 and the input contact rows of the driver tabs allows the signals originating from controller 136 to be conveyed to the driver chips disposed on the driver tabs by way of flex circuit 160.

Unless discussed above, the above described elements of the various embodiments of this invention are manufactured and connected to one another by conventional methods commonly used throughout the art.

Once given the above disclosure, therefore, various other modifications, features or improvements will become apparent to the skilled artisan. Such other features, modifications, and improvements are thus considered a part of this invention, the scope of which is to be determined by the following claims:

We claim:

1. A liquid crystal display comprising:

first and second polarizers sandwiching a liquid crystal layer therebetween;

electrode means for applying a voltage across said liquid crystal layer;

a heater means for heating said liquid crystal layer, said heater means including a conductive layer with a flex buss bar mounted thereon;

a substantially flat and transparent substrate having said heater means mounted thereon, said substrate being subject to stress concentrations;

said substrate and said heater means being disposed adjacent said first polarizer, said flex buss bar for delivering power to said conductive layer thereby substantially heating said conductive layer and enabling said conductive layer to heat said liquid crystal display, and wherein said flex buss bar is sufficiently thin so that substantially no gap is provide adjacent said heater means whereby said stress concentrations are substantially eliminated.

2. The display of claim 1, wherein said heater means is disposed immediately adjacent the exterior planar surface of said first polarizer with said flex buss bar being sandwiched between said conductive layer and said exterior planar surface of said first polarizer.

3. The display of claim 1, wherein said heater means comprises two substantially parallel flex buss bars, said buss bars extending across said conductive layer nearly the full length thereof, and wherein said conductive layer is made of indium-tin-oxide (ITO) and said substrate is made of glass.

4. The display of claim 1, wherein said flex buss bar includes a base layer and a conductive trace layer, said trace layer being in contact with said conductive layer.

5. The display of claim 4, wherein said base layer is made of a polyimide and said trace layer includes etched copper.

6. The display of claim 4, wherein said flex buss bar is less than about 0.005 inch thick thereby enabling said flex buss bar to be sandwiched between said conductive layer and said first polarizer.

7. The display of claim 4, wherein said flex buss bar includes a first portion and a second portion, said first portion being adhered to said conductive layer and substantially parallel thereto, and said second portion extending outward from the periphery of said conductive layer and being bent orthogonally relative thereto.

8. The display of claim 7, wherein said second portion of said flex buss bar is affixed to a ring-shaped flex circuit, said ring-shaped flex circuit for electrically interfacing substantially all of row and column address lines of said display with a display output controller, said ring-shaped flex circuit being disposed adjacent each of four peripheral sides of said display.

9. The display of claim 8, wherein said second portion of said flex buss bar extends orthogonally from a beveled corner of said conductive layer, said second portion being affixed to a corner tang of said ring-shaped flex circuit, said display further comprising a temperature sensor affixed to said ring-shaped flex circuit, said sensor for determining the temperature of said display and instructing said controller to selectively activate said heater means in accordance with said determined temperature.

10. The display of claim 1, wherein said heater is disposed interior of said first polarizer whereby said heater means is sandwiched between said first polarizer and said liquid crystal layer.

11. The display of claim 10, wherein said heater means is disposed immediately adjacent the interior planar surface of said first polarizer.

12. A heater assembly for a liquid crystal display, said heater assembly comprising:

a conductive layer disposed on a transparent substrate;

means for energizing said conductive layer in order to heat said liquid crystal display, said means including a pair of flex buss bars mounted on said conductive layer;

said flex buss bars each having a first and second portion, said first portion being adhered and parallel to said conductive layer, and said second portion extending outwardly from the periphery of said conductive layer;

wherein said first and second portions of said flex buss bars include a base polyimide layer and a conductive trace layer, said trace layers of said first portions being in electrical contact with said conductive layer; and wherein said transparent substrate and said conductive layer have beveled peripheral corner areas from which said second portions of said flex buss bars extend.

13. The heater assembly of claim 12, wherein said conductive layer is made of ITO, said trace layer is made of copper, and said transparent substrate is made of glass.

14. The heater assembly of claim 12, wherein said transparent substrate is disposed adjacent the exterior planar surface of the rear polarizer of said display, said conductive layer and said flex bar being sandwiched between said rear polarizer and said transparent substrate.

15. A process of making a liquid crystal display, said process comprising the steps of:

a) providing first and second polarizers sandwiching a liquid crystal layer therebetween;

b) providing electrodes for applying a voltage across said liquid crystal layer;

c) disposing a heater adjacent said first polarizer, said heater including a conductive layer and a substantially planar flex buss bar disposed on a substantially flat and transparent substrate, said buss bar for delivering power to said conductive layer thereby substantially heating said conductive layer and enabling said conductive layer to heat said liquid crystal display and wherein said flex buss bar is sufficiently thin so that substantially no gap is provided adjacent said heater whereby stress concentrations are substantially eliminated.

* * * * *